(12) United States Patent
Chong et al.

(10) Patent No.: US 9,391,581 B2
(45) Date of Patent: Jul. 12, 2016

(54) METHODS AND DEVICES FOR PROTECTING BAND REJECTION FILTERS FROM EXTERNAL FORCES

(71) Applicant: Radio Frequency Systems, Inc., Meriden, CT (US)

(72) Inventors: Yin-Shing Chong, Middletown, CT (US); Yunchi Zhang, Wallingford, CT (US); Stanley Michnowicz, East Hampton, CT (US)

(73) Assignee: ALCATEL-LUCENT SHANGHAI BELL CO., LTD, Shanghai (CN)

( * ) Notice: Subject to any disclaimer, the term of this patent is extended or adjusted under 35 U.S.C. 154(b) by 38 days.

(21) Appl. No.: 14/194,629

(22) Filed: Feb. 28, 2014

(65) Prior Publication Data
US 2015/0250068 A1  Sep. 3, 2015

(51) Int. Cl.
| | |
|---|---|
| H03H 7/01 | (2006.01) |
| H05K 5/02 | (2006.01) |
| H05K 7/18 | (2006.01) |
| H04Q 1/02 | (2006.01) |
| H01P 1/30 | (2006.01) |
| H04B 1/03 | (2006.01) |

(52) U.S. Cl.
CPC ............ *H03H 7/0138* (2013.01); *H01P 1/30* (2013.01); *H04Q 1/11* (2013.01); *H05K 5/0217* (2013.01); *H05K 7/186* (2013.01); *H04B 1/03* (2013.01)

(58) Field of Classification Search
CPC ..... H03H 7/0138; H03H 7/0115; H03H 7/01; H05K 7/186; H05K 5/0217
USPC ................................................. 333/176, 185
See application file for complete search history.

(56) References Cited

U.S. PATENT DOCUMENTS

| | | | | |
|---|---|---|---|---|
| 4,296,390 | A | * | 10/1981 | Vanderheyden et al. ...... 333/182 |
| 6,028,498 | A | * | 2/2000 | Bickford ........................ 333/260 |
| 6,292,665 | B1 | * | 9/2001 | Hildebrand et al. ........ 455/456.4 |
| 2012/0313733 | A1 | * | 12/2012 | Bernhardt et al. ............. 333/204 |

* cited by examiner

*Primary Examiner* — Robert Pascal
*Assistant Examiner* — Rakesh Patel
(74) *Attorney, Agent, or Firm* — Capitol Patent & Trademark Law Firm, PLLC

(57) ABSTRACT

Band rejection filters are protected from the adverse effects of external forces such as stresses, strains and vibrations from external loads and winds by utilizing a protective frame and dampers.

19 Claims, 3 Drawing Sheets

METHODS AND DEVICES FOR PROTECTING BAND REJECTION FILTERS FROM EXTERNAL FORCES

INTRODUCTION

Existing wireless base stations use band-rejection filters to permit the transmission and reception of some radio frequencies and attenuate or prohibit others.

In addition, band-rejection filters also function to carry some loads, such as a mechanical load (e.g., weights) and loads due to the force of winds. However, traditional band-rejection filters are very sensitive to vibrations and other forces that result from carrying a load. For example, an external force may change the physical structure of the filter which, in turn, may change the electrical function and performance of the filter because a traditional filter has a steep roll off at its attenuated frequencies. Said another way, if the physical structure of the filter is changed, the frequencies that it may attempt to pass or attenuate may change as well. In effect, the filter will become detuned and unreliable because it will attempt to pass undesirable frequencies.

SUMMARY

Exemplary embodiments of methods and devices for protecting band rejection filters from external forces are provided.

According to an embodiment, a band rejection filter apparatus (i.e., device) may comprise: an electrical filter section configured to receive a first range (e.g. 698 to 805 MHz) of radio frequency (RF) signals, and to output a second range (e.g., 698 to 715 and/or 728 to 805 MHz) of RF signals that is a subset of the first range of RF signals; a frame configured to support the electrical filter section; and a plurality of dampers connected to the frame, and operable to reduce the effects of external forces applied to the frame or electrical filter section. In addition, the filter apparatus may comprise one or more connectors, each connector configured to be connected to the frame on one side and to the external load (e.g., base station transceiver) on a second side.

In one embodiment one or more of the dampers may comprise an elastomer damper (e.g., rubber dampers), or, alternatively, a mechanical spring, (e.g., 0.5 inch diameter spring) or a combination of the two types of dampers.

In other embodiments the frame may comprise an aluminum frame. Still further, in yet further embodiments each one of the plurality of dampers may be connected to a side of the frame, or, alternatively, to a different side of the frame. The dampers may be the same size, or alternatively may be different sizes. For example, in one embodiment, at least one of the plurality of dampers is smaller in size than a remainder of the dampers. In addition to the apparatuses described above and herein exemplary, related methods are also provided.

In one embodiment an exemplary method may comprise: receiving a first range of radio frequency (RF) signals, and outputting a second range of RF signals that is a subset of the first range of RF signals, from a band rejection electrical filter section; supporting the filter section using a frame (e.g., aluminum frame); and reducing the effects of external forces applied to the frame or filter section using a plurality of dampers connected to the frame. The first range may comprise a range of 698 to 805 MHz while the second range may comprise a range of 698 to 715 MHz and/or 728 to 805 MHz. The frame may be connected to a base station transceiver.

This method may further comprise further reducing the effects of external forces applied to the frame or filter section using one or more connectors, each connector configured to be connected to the frame on one side and to the external load on a second side.

As explained previously, the one or more of the dampers may comprise an elastomer (e.g., rubber), or a mechanical spring or a combination of the two types of dampers, and each one of the plurality of dampers may be connected to a different side (or same side) of the frame. Yet further, at least one of the plurality of dampers may be a different size (e.g., smaller) than a remainder of the dampers.

Additional features of the inventions will be apparent from the following detailed description and appended drawings.

DETAILED DESCRIPTION, INCLUDING EXAMPLES

Figure 1A:
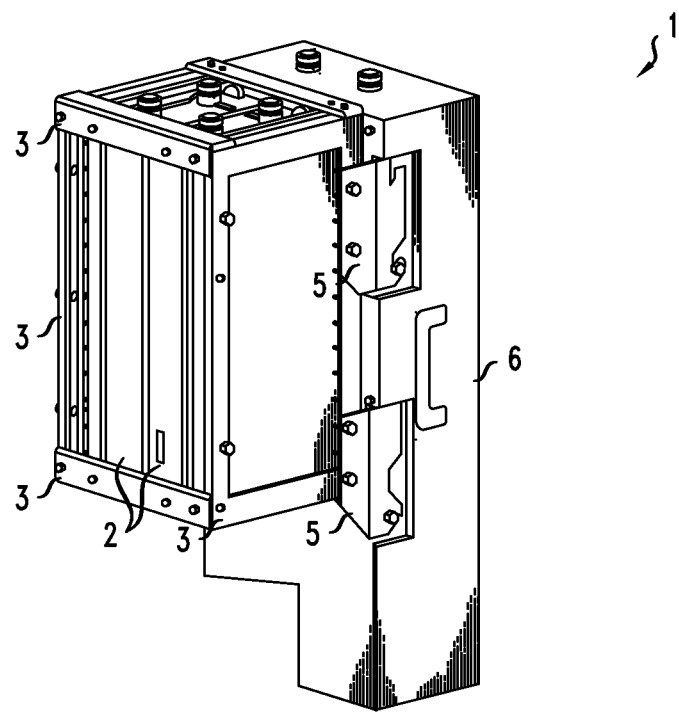
FIGS. 1a and 1b depict an exemplary band rejection filter apparatus according to exemplary embodiments of the invention.

Exemplary embodiments for protecting band rejection filters, used in wireless base stations, from external factors are described herein and are shown by way of example in the drawings. Throughout the following description and drawings, like reference numbers/characters refer to like elements.

It should be understood that, although specific exemplary embodiments are discussed herein there is no intent to limit the scope of present invention to such embodiments. To the contrary, it should be understood that the exemplary embodiments discussed herein are for illustrative purposes, and that modified and alternative embodiments may be implemented without departing from the scope of the present invention. Further, though specific structural and functional details may be disclosed herein, these are merely representative for purposes of describing the exemplary embodiments.

It should be noted that one or more exemplary embodiments may be described as a process or method. Although a process/method may be described as sequential, it should be understood that such a process/method may be performed in parallel, concurrently or simultaneously. In addition, the order of each step within a process/method may be re-arranged. A process/method may be terminated when completed, and may also include additional steps not included in a description of the process/method.

As used herein, the term "and/or" includes any and all combinations of one or more of the associated listed items. As used herein, the singular forms "a," "an" and "the" are intended to include the plural form, unless the context indicates otherwise.

As used herein, the term "embodiment" refers to an embodiment of the present invention.

In accordance with embodiments of the present invention, band rejection filters are protected or isolated from the effects of external forces, such as mechanical loads and wind. This may be achieved by "cocooning" or otherwise surrounding (either fully or partially) a band rejection filter with a frame, and supporting the frame and filter with vibration and shock absorbing components. The absorbing components may be of various design, such as elastomers or springs though other equivalent components may be used. Such a frame assists and relieves the filter from carrying an external load.

Figure 1B:
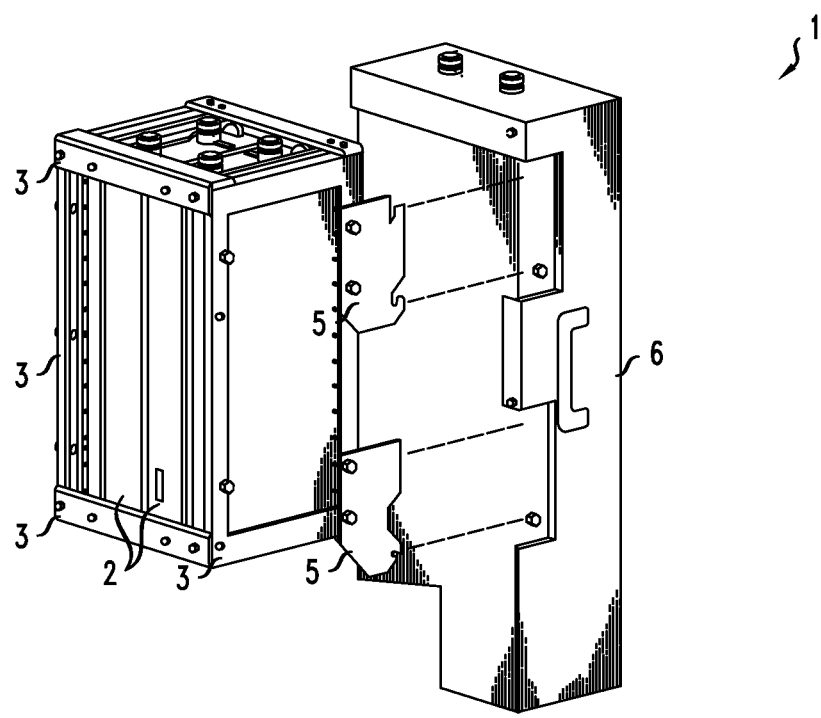

Referring now to FIGS. 1a and 1b there are depicted exemplary band rejection filter apparatuses 1 that may be used in wireless base stations according to embodiments of the invention. In one embodiment the apparatuses 1 may be connected to a base station transceiver 6. In FIG. 1a the band rejection filter apparatus 1 comprises an electrical filter section 2 configured to receive a first range (e.g. 698 to 805 MHz) of radio frequency (RF) signals, and to output a second range (e.g., 698 to 715 and/or 728 to 805 MHz) of RF signals that is a subset of the first range of RF signals. The apparatus 1 is shown with a filter cover removed revealing the filter section 2 inside. The apparatus 1 further comprises a frame 3 configured to support the electrical filter section 2. The frame may be made of aluminum or another suitable material.

While FIG. 1a depicts the frame 3 connected to an external load 6 by one or more connectors 5, FIG. 1b depicts the frame 3 in the process of being connected to the external load 6 using one or more connectors 5. In an embodiment, each connector 5 may be configured to be connected to the frame 3 on one side and to the external load 6, such as a base station transceiver (e.g., remote radio head (RRH) transceiver), on a second side. It should be understood that other types of loads may also be connected to the frame 3 by the connectors 5. The connectors may comprise a combination of aluminum or metallic brackets and fasteners, such as screws, bolts, washers and the like or other suitable means for connecting the frame 3 to the external load 6. In accordance with embodiments of the invention the connectors 5 function to carry the load of (i.e., forces applied by) the external load 6 without imparting adverse forces, such as stresses, strains and vibrations, for example, to the filter section 2.

Figure 2A:
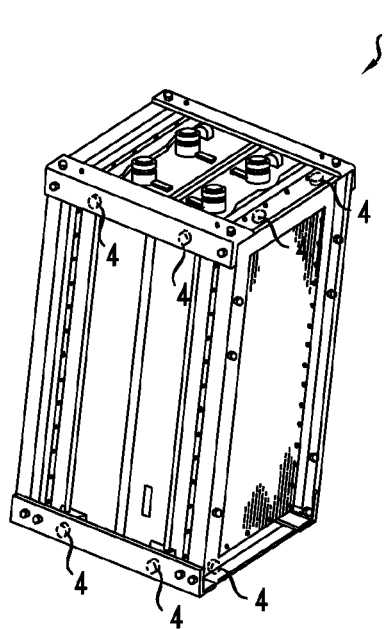
FIGS. 2a through 2c depict different views of an exemplary band rejection filter apparatus with dampers according to embodiments of the invention.
Figure 2B:
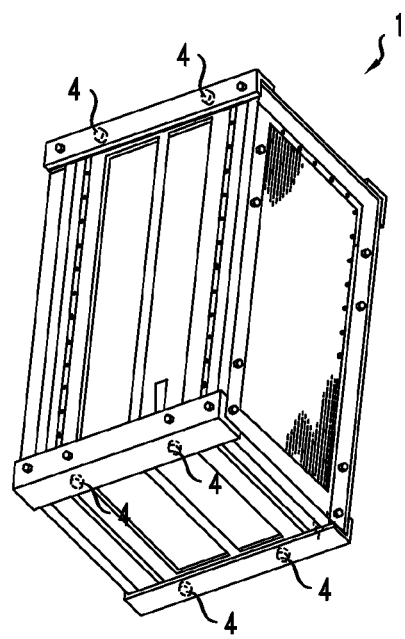
Figure 2C:
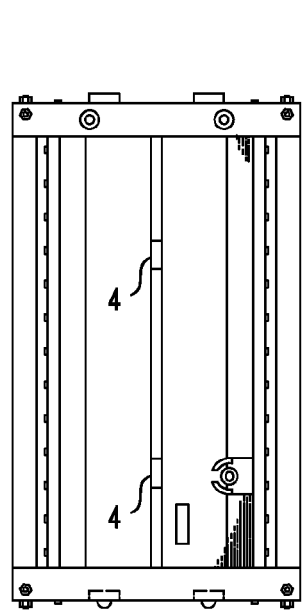

Referring now to FIGS. 2a through 2c, there is shown different views of an apparatus 1 that includes a plurality of dampers 4 connected to the frame 3. In embodiments of the invention the dampers 4 are operable to reduce the effects of external forces applied to the frame 2 and/or electrical filter section 2. Such external forces may be an mechanical load or wind, and may take the form of stresses, strains, vibrations and the like. In one alternative embodiment one or more of the dampers 4 may comprise an elastomer, such as rubber. In another embodiment, one or more of the dampers 4 may comprise a mechanical spring (e.g., a 0.5 inch in diameter spring). In still another embodiment the dampers may comprise a combination of the two types of dampers, or similar functioning devices that function as dampers.

Figure 3:
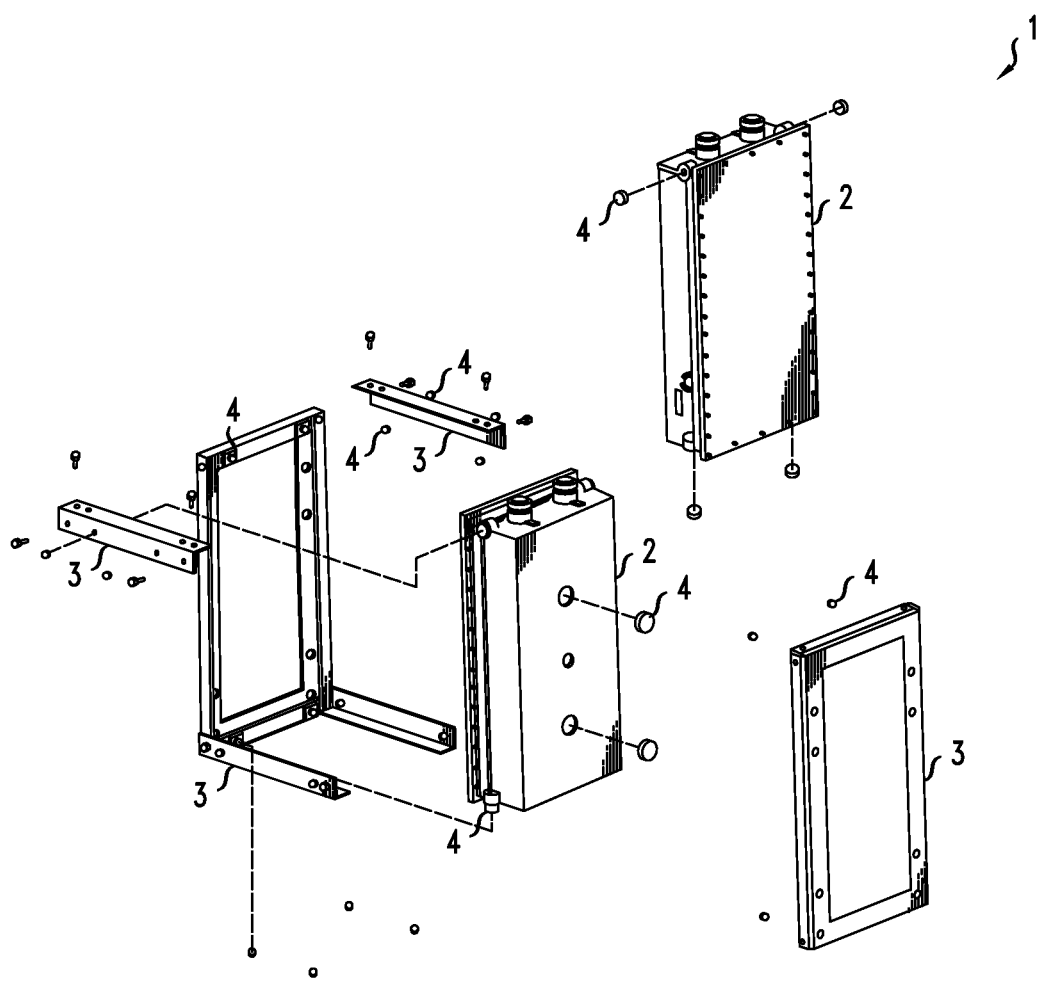
FIG. 3 depicts an exploded view of an exemplary band rejection filter apparatus with dampers according to an embodiment of the present invention.

Referring to FIG. 3, there is depicted an exploded view of an exemplary band rejection filter apparatus 1 with dampers 4 according to an embodiment of the present invention. As shown, the apparatus 1 includes dampers 4 attached to on all sides of the frame 3, and operable to protect or isolate the filter section 2 from external forces applied to the frame 3 or filter section 2. As depicted, the dampers 4 may be placed in between the frame 3 and filter section 2. In exemplary embodiments the location of the dampers may be selected so that the dampers 4 are supported by the frame 3 and do not adversely affect the operation or performance of filter section 2. In one embodiment the dampers 4 may be vibration dampers that are operable to absorb vibrations applied to the frame 3 by an external force. In other embodiments the dampers may be stress or strain dampers or may be stress/strain/vibrational dampers operable to absorb stresses, strains and/or vibrations from external forces.

As shown in FIG. 3, the frame has a number of sides. In the embodiment depicted in FIG. 3 a damper 4 is connected to a side (e.g., each side) of the frame 3. It should be understood that, depending on the specific shape and design of the frame and filter section, the number of frame sides may vary, and, so too the distribution and placement of the dampers may vary. In accordance with an embodiment of the invention, each one of the plurality of dampers may be connected to a different side of the frame. Further, at least one of the plurality of dampers may be smaller in size than a remainder of the dampers. Yet further, the dampers may vary in size from damper to damper.

In accordance with additional embodiments, the frame 3 may designed to be structurally strong to the weight of the filter section 2 and the external load 6. In the case of an RRH, that may be 50 lbs. Besides the weight of an RRH, the frame 3 and connectors 5 may be operable to withstand forces from winds as high as 200 miles per hour without imparting external forces (stresses, strains, vibration, etc.) on the filter section 2. Accordingly, detuning of the filter section 2 may be prevented.

While exemplary embodiments have been shown and described herein, it should be understood that variations of the disclosed embodiments may be made without departing from the spirit and scope of the claims that follow.

We claim:

1. A band rejection filter apparatus comprising:
an electrical filter section configured to receive a first range of radio frequency (RF) signals, and to output a second range of RF signals that is a subset of the first range of RF signals;
an aluminum frame configured to support the electrical filter section; and
a plurality of dampers positioned on horizontal and vertical surfaces of the frame, and operable to reduce the effects of external forces applied to the frame or electrical filter section by isolating the frame from external loads.

2. The apparatus of claim 1 further comprising:
one or more connectors, each connector configured to be connected to the frame on one side and to the external loads on a second side.

3. The apparatus as in claim 2 wherein the external loads comprise a base station transceiver.

4. The apparatus as in claim 1 wherein one or more of the plurality of dampers comprises a mechanical spring.

5. The apparatus as in claim 1 wherein one or more of the plurality of dampers comprises an elastomer.

6. The apparatus as in claim 1 wherein each one of the plurality of dampers is connected to a different side of the frame.

7. The apparatus as in claim 1 wherein a configuration of at least one of the plurality of dampers is smaller in size than a remainder of the plurality of dampers.

8. The apparatus as in claim 1 wherein the first range comprises 698 to 805 MHz.

9. The apparatus as in claim 1 wherein the second range comprises 698 to 715 MHz or 728 to 805 MHz.

10. A band rejection filter apparatus comprising:
an electrical filter section configured to receive a first range of radio frequency (RF) signals, and to output a second range of RF signals that is a subset of the first range of RF signals;
an aluminum or metallic frame configured to support the electrical filter section; and
a plurality of dampers positioned on horizontal and vertical surfaces of the frame, and operable to reduce the effects of external forces applied to the frame or electrical filter section by isolating the frame from external loads.

11. A method of reducing external forces on a band rejection filter comprising:

receiving a first range of radio frequency (RF) signals at, and outputting a second range of RF signals that is a subset of the first range of RF signals from, a band rejection electrical filter section;

supporting the filter section using an aluminum or metallic frame;

positioning a plurality of dampers on horizontal and vertical surfaces of the frame to isolate the frame from external loads to thereby reduce the effects of the external forces applied to the frame or filter section.

12. The method of claim 11 further comprising:

further reducing the effects of the external forces applied to the frame or filter section using one or more connectors, each connector configured to be connected to the frame on one side and to the external loads on a second side.

13. The method as in claim 12 wherein the external loads comprise a base station transceiver.

14. The method as in claim 11 wherein one or more of the plurality of dampers comprises a mechanical spring.

15. The method as in claim 11 wherein each one of the plurality of dampers is connected to a different side of the frame.

16. The method as in claim 11 wherein a configuration of at least one of the plurality of dampers is smaller in size than a remainder of the plurality of dampers.

17. The method as in claim 11 wherein the second range comprises 698 to 715 MHz or 728 to 805 MHz.

18. The method as in claim 11 wherein the first range comprises 698 to 805 MHz.

19. The method as in claim 11 wherein one or more of the plurality of dampers comprises an elastomer.

* * * * *